United States Patent [19]

Svetkoff et al.

[11] Patent Number: 5,815,275
[45] Date of Patent: *Sep. 29, 1998

[54] METHOD AND SYSTEM FOR TRIANGULATION-BASED, 3-D IMAGING UTILIZING AN ANGLED SCANNING BEAM OF RADIANT ENERGY

[75] Inventors: Donald J. Svetkoff, Ann Arbor; Donald K. Rohrer, Whimore Lake, both of Mich.; David A. Noblett, Aqoura; Robert L. Jackson, Moorpark, both of Calif.

[73] Assignee: General Scanning, Inc., Simi Valley, Calif.

[ * ] Notice: The term of this patent shall not extend beyond the expiration date of Pat. No. 5,617,209.

[21] Appl. No.: 825,108

[22] Filed: Mar. 27, 1997

Related U.S. Application Data

[63] Continuation of Ser. No. 429,543, Apr. 27, 1995, Pat. No. 5,617,209.

[51] Int. Cl.⁶ .................................................. G01B 11/24
[52] U.S. Cl. ............................................................ 356/376
[58] Field of Search .................................. 356/376, 394, 356/398; 382/149, 150, 151; 348/131, 126, 82

[56] References Cited

U.S. PATENT DOCUMENTS

| 4,700,045 | 10/1987 | Merry et al. . |
| 4,728,195 | 3/1988 | Silver . |
| 4,811,410 | 3/1989 | Amir et al. . |
| 5,058,178 | 10/1991 | Ray . |
| 5,118,192 | 6/1992 | Chen et al. . |
| 5,192,982 | 3/1993 | Lapucci . |
| 5,200,799 | 4/1993 | Maruyama et al. . |
| 5,371,375 | 12/1994 | Stern et al. . |

*Primary Examiner*—Frank G. Font
*Assistant Examiner*—Amanda Merlino
*Attorney, Agent, or Firm*—Brooks & Kushman P.C.

[57] ABSTRACT

A method and system for three-dimensional imaging of objects, including integrated circuit interconnections and many other microelectronic assemblies and miniature parts, is used to greatly improve the efficiency of triangulation-based laser line scanning systems. A scanning beam is incident at a normal angle to the X,Y inspection plane with the scan line oriented at 45°, diagonal to an axis defining a first direction of motion. Motion of the imaging head along the axis is used to acquire line scan images in the non-orthogonal coordinate system having symmetry about the orthogonal axes of motion.

52 Claims, 7 Drawing Sheets

TAPE AUTOMATED BONDING (TAB)

FLIP CHIP (OR BUMPED DIE)
STAGGERED INTERCONNECT PATTERN

Fig. 13

METHOD AND SYSTEM FOR TRIANGULATION-BASED, 3-D IMAGING UTILIZING AN ANGLED SCANNING BEAM OF RADIANT ENERGY

This is a continuation of application Ser. No. 08/429,543 filed on Apr. 27, 1995, now U.S. Pat. No. 5,617,209.

CROSS-REFERENCE TO RELATION APPLICATION

This application is related to U.S. patent application Ser. No. 08/245,864 entitled "Triangulation-Based 3D Imaging And Processing Method And System", filed May 17, 1994 U.S. Pat. No. 5,546,189, and which is hereby incorporated in its entirety by reference herein.

TECHNICAL FIELD

This invention relates to triangulated-based, 3-D imaging methods and systems and, in particular, to triangulation-based 3-D imaging methods and systems which utilize an angled scanning beam of radiant energy such as laser light.

BACKGROUND ART

Performance specifications for three-dimensional sensors vary widely, with a figure of merit often determined based upon specific requirements. Many applications impose simultaneous demands of rapid data rates for 100% coverage of the entire inspection area yet accuracy and precision measured in microns or perhaps finer. In other cases, very high speed inspection may be required in areas of interest, with other regions ignored.

With increasing trends toward miniaturization, manufacturers of microelectronic assemblies and miniature parts often have requirements for very fine measurement or defect detection capability for automatic three-dimensional optical inspection equipment. Tradeoffs exist between the field of view, spot size, depth sensitivity, and measurement speed. Because measurement requirements are demanding, a system which is optimized for imaging only areas of interest and can avoid "dead" areas can provide effective solutions for process monitoring where specific regions of interest are monitored, provided the system is also effective for 100% inspection.

Figure 1:
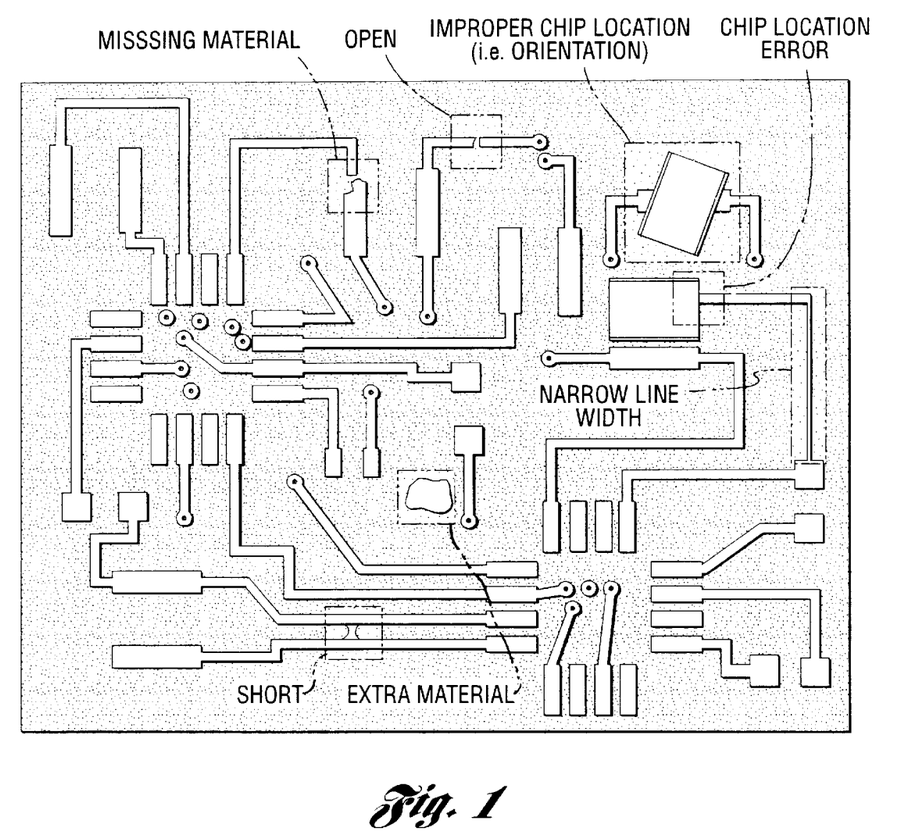
FIG. 1 is a view of a typical microelectronic assembly.

For inspection of microelectronic assemblies and other miniature parts, the data rate is a key parameter, and the attainable inspection speed is dependent upon the pattern to be inspected. FIG. 1 illustrates a case where the inspection sites are "randomly" arranged, the inspection task may be height and width measurements of all circuit traces, solder height, and component dimensions. Defects like extra material, missing material, and misplaced devices must also be detected. Such defects are indicated by dashed "boxes" in FIG. 1. There is very little "dead area" which can be ignored by the inspection system. Suppose the region in FIG. 1 represents a small section (say 0.1"×0.1") of a dense patterned wafer. If the inspection system utilizes a typical dynamic focus probe about 1000 data points per second will be acquired. Suppose that 2.5 $\mu$m×2.5 $\mu$m samples (which can be coarse for inspection of such devices) are taken over the entire surface. The resulting inspection time for a 6"×6" object is 1.3 months! Point triangulation sensors currently available operate at about 10,000 points per second and reduce the inspection time to a few days, and with special designs can achieve data rates of about 100 KHz. Although it is possible to increase the data rate of point probes to video rates (1000 fold improvement), the requirements for the necessary motion mechanism would be unwieldy and perhaps completely impractical.

On the other hand, a significant fraction of all microelectronic assemblies have inspection sites which are regularly arranged in a series of rows and columns, often along the sides of a rectangle or square. FIGS. 2 through 5 illustrate several cases of importance. Such patterns are found over a large scale, lead widths from a few mils (1 mil=0.001") to tens of mils, and ball (and bump) diameters from 10 microns (bumped die) to about 1 mm (BGA 225). The interconnect patterns are similar at these scales. However, the reduced coverage requirement does not guarantee that the data rate requirement (square inches/second, sites/second, etc.) can be substantially reduced. The minutes allowed for a video rate system to perform 100% inspection of a wafer may be reduced to a few seconds for 100% inspection of lead or bonding sites (electrical interconnections). Inspection requirements for such regions usually correspond to a three dimensional measurement of the lead (ball or pad) geometry, coplanarity, and width. These measurements may be in the production line (1 chip at a time) or "in-tray" (FIG. 6) to inspect the three-dimensional structure of leads and solder pads (FIG. 5) of ICs after placement. Improper placement (in 3D) can create defects which are not evident until after soldering thereby greatly increasing board scrap and rework costs. This application requires high resolution and very high data rates, approximately 3–4 seconds per chip, for inspecting all the sites on a board without affecting production throughput. Other applications (requiring a finer scale) in microelectronics having similar requirements include three dimensional inspection of wirebond and bumped wafer patterns.

A 3-D line scan sensor which has capability for 100% inspection (figure of merit in square inches/second or sites/second), yet can be controlled to optimize inspection for a regular, repetitive pattern (figure of merit typically sites/second) can significantly increase the utility of the inspection system. Accuracy and high speed, which are mutually conflicting parameters, are both required to maximize the return on investment of inspection equipment and widespread applicability of the inspection equipment in the industry.

3-D line-scan triangulation-based sensors which approach video rates, as described in U.S. Pat. No. 5,024,529, reduce the time for 100% inspection of the above sample to several minutes which is acceptable for many facilities. This patent is hereby incorporated by reference herein.

Of all known methods for 3-D imaging, triangulation provides the most practical method for a high speed-accuracy product (figure of merit). However, unlike point triangulation sensors, laser line scan systems do not have rotational symmetry. A scan line may be viewed in either the longitudinal or transverse directions (depends upon preference), in either case the height is being derived from a geometric relationship along a position sensing axis. Although it is possible to derive mathematical transformations which will provide exact registration between height values obtained at arbitrary viewpoints, the implementation of the hardware and software to support the requirements requires substantial additional effort.

Although imaging speed is crucial, accuracy is an issue which is equally important. Triangulation-based sensors require off-axis arrangements for illumination/viewing and a necessary extended instantaneous field of view (IFOV) along the depth sensing axis. Certain part geometries create difficulties with occlusion and associated spurious reflections.

Figure 7:
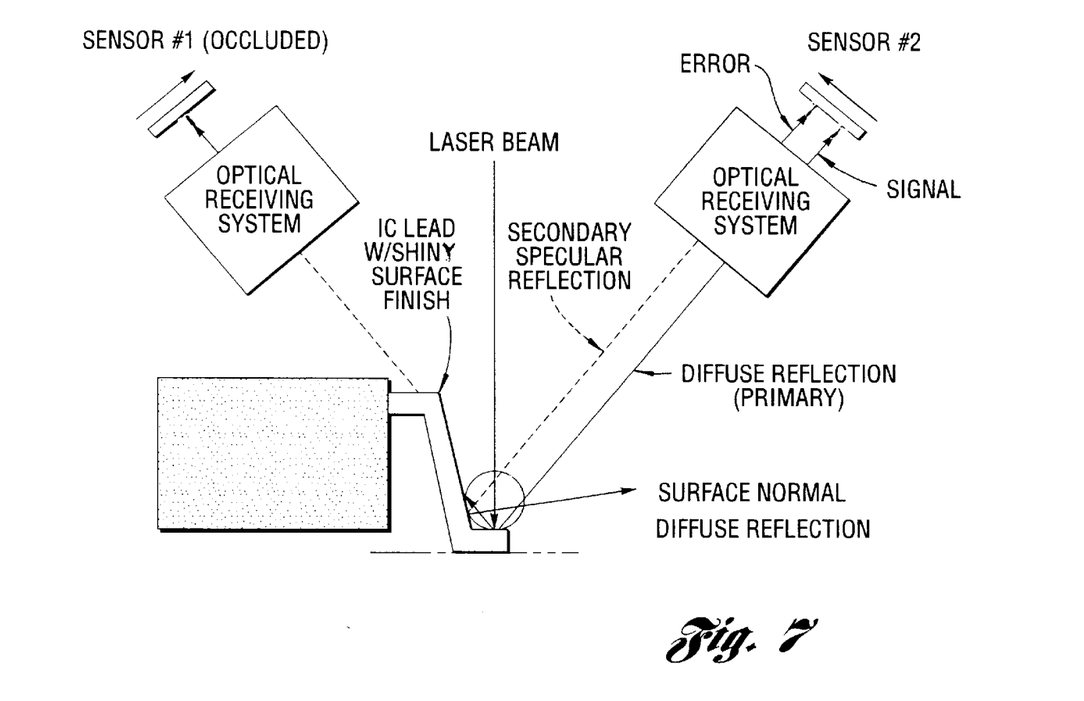
FIG. 7 is a schematic side elevational view illustrating anomalies which arise in triangulation-based systems.

FIG. 7 illustrates problems occurring when inspecting the leads of an IC. In FIG. 7, the compound problem of occlusion and secondary specular reflection is illustrated when an IC is imaged with the surrounding area being flat (without three dimensional structure), and the problem will be further compounded if additional surfaces (i.e. walls of a tray containing parts) are added. The IC leads are metallic, and may have a smooth, shiny appearance. In this case, obtaining useful data with both sensors at this orientation requires a relatively narrow viewing angle (<20 degrees). However, anomalies can still exist in certain geometries because one sensor may be partially occluded and the second is corrupted by secondary reflections. Both problems "disappear" if the same leads are viewed from the orthogonal direction. The secondary specular reflection is not received by either sensor, and no obstruction is present which will adversely affect inspection capability. Hence, an appropriate choice of imaging geometry makes a significant difference in capability.

Figure 8:
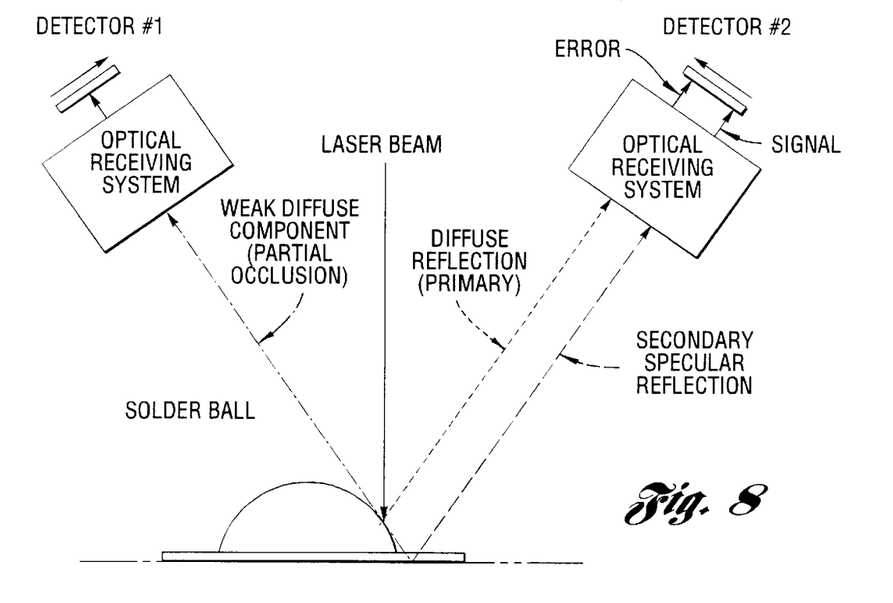
FIG. 8 is a schematic side elevational view, similar to FIG. 7, illustrating similar effects on BGA's.

FIG. 8 illustrates a somewhat different but common scenario for BGAs, circularly symmetric bumps or bonding pads. Detector 1 receives a weak signal due to the surface orientation (shading) while detector 2 receives a strong signal (in error) resulting from secondary reflections from the shiny bonding pad. The more complex problem of dealing with a curved surface, shiny finish, and partial occlusion must be addressed with the use of multiple sensors and non-linear pattern recognition and multi-channel estimation techniques, where both the intensity and range information are used to eliminate readings in error. This approach is described in detail in copending U.S. patent application Ser. No. 08/245,864.

A versatile 3-D triangulation-based imaging system providing both high measurement speed and improved accuracy should result in increased application of automated 3-D measurement.

Stern et al., U.S. Pat. No. 5,371,375, discloses a method and system for scanning IC leads in a tray using a two-pass approach resulting from a limited sensor field of view (FOV). The first pass uses a sensor to locate features from which the necessary translation and rotation is computed for a second pass. The 3-D sensor then measures the lead dimensions. The small field of view is a requirement if CCDs or photodiode arrays are to be used, because of readout limitations (60 fields/second standard video). If a small array (say 64×64) is used, the data rate can be increased to roughly 4000 lines/second maximum which is within typical requirements for lead inspection. However, the TV sensor technology is not well matched for high speed 100% inspection. For example, the line rate would be decreased to about 60 lines/second if standard arrays are used for wide field scanning.

Chen et al., U.S. Pat. No. 5,118,192, discloses a triangulation-based scanning system constructed to have projection and viewing axes independently pivotable, thereby providing flexibility for inspection and measurement of irregular objects. The 3-D scanning method can also be employed for inspection of IC leads in a tray, solder joints and other regularly arranged patterns and provides for multiple axes of illumination and viewing. The pivoting action also allows for triangulation-based measurement along orthogonal rows and columns, provided that a rotary mechanism is utilized for 90° dynamic head rotation.

Tokura, U.S. Pat. No. 5,192,982, discloses a laser scanning method for inspection of soldered leads. The problems with directional reflectance (asymmetry) and resulting invalid data are recognized and the illumination and viewing directions are chosen accordingly. The system is designed primarily for examining the appearance of solder fillets which are smooth and have a shiny surface finish.

Maruyama et al., U.S. Pat. No. 5,200,799, discloses a 3-D laser scanning system for inspection of parts packaged on PCBs which utilizes a pair of position sensitive detectors and an image processing system, including a circuit for multi-sensor pre-processing. The illustrated embodiment includes a polygon laser scanning system and a large lens for wide FOV coverage, up to 100% of the circuit board. The inertia of the rotating mirror prevents "region of interest" or random access scanning. The scanning method includes movement of the circuit board along a Y axis and a scan beam along an X axis. This typical scanning method restricts the viewpoint of the system leading to consideration of issues shown in FIG. 7. Also, a tradeoff exists between the wide field coverage, resolution, and effective data rate and is further illustrated herein.

Ray, U.S. Pat. No. 5,058,178, describes an imaging system for detecting missing or defective solder bumps. The system uses dark field illumination and a TV camera. 3D data is not acquired so the system is not capable of providing coplanarity measurements, and is highly sensitive to the wide variations in reflectance and background variations which are found for metallic surfaces. The system can be successfully used for detecting missing material or gross soldering defects at relatively fast data rates.

Merry et al., U.S. Pat. No. 4,700,045, describes the use of an acousto-optic deflector and programmable scan width for following a random seam on a surface. A tradeoff can be made between the scan speed of the stage and the number of points collected for each scan line. The nature of (commercially available) acousto-optic deflectors allows for "windowing" capability as the deflection is proportional to an applied frequency which, in turn, can be programmed through computer control. These solid-state deflectors are preferred. Galvonometer-based deflectors also allow for random beam deflection but require moving mechanical parts and additional circuitry or other means for stabilization and position correction.

Commercially Available Systems

ICOS Lead Inspector: A commercially available system examines the coplanarity and width of IC leads. Four light sources (one at each corner of a square) are sequentially projected onto the part and a shadow image projected onto a frosted plate is analyzed to obtain lead dimensional information. The length of the shadows are related to the lead positions by a geometric calculation. The image is acquired with a standard video camera and frame grabber system. Although the implementation requires only a single field of view, the system is limited because much of the image area contains the chip body and, as the lead pitch decreases and the lead count increases, the system will become limited. The image resolution is limited, typically 4–8 times coarser than what is available for a system where image data is concentrated near the leads. The concept is fine for coarse pitch devices and "pass-fail" inspection. For process control, multiple cameras or larger arrays will likely be needed leading to a more expensive design. The technique is not well suited for "in-tray" inspection where shadow casting is impractical, as the tray background is low in reflectance leading to poor contrast for shadow measurements. Tray geometry is inconsistent, which can affect the shadow length measurement.

Modular Vision Systems (MVS): Offers the LaserVision series (introduced in early 90's) of lead scanners for inspection of IC lead dimensions for parts in a tray or otherwise configured. The system uses multiple CCD cameras and orthogonal lines of laser light for inspection. As with all camera-based structured light systems, the resolution/speed product is limited. Approximately 60 lines each second are acquired with the system. Laser line scan systems employing beam deflectors are able to acquire about 15000 lines/second, thereby allowing for part inspection at much finer resolution. With random access or "windowing" capability, even higher data rates may be achieved. The use of orthogonal lines of light and multiple cameras does eliminate the requirement for dynamic rotation of the imaging head. A true "Random Access" camera, such as being proposed by CID Technologies, could provide improvements in the future but the data rate will be substantially slower than laser scanning systems for "full field" acquisition, and a reduced depth range will result. The system is much too slow for 100% inspection of dense patterns.

Cyber-Optics: Offers a lead coplanarity inspection system (supplied by Fuji, Mode FIP-II). The system uses crossed beams for inspection of leads as with the ICSO system. Inspection is typically done "after pick and before place" (i.e. just before components are mounted on PC boards). The part handler rotates each device by 90° to support scanning requirements. The system requires transillumination, and it appears that significant modifications of the production process would be required to provide a functional unit for "in-tray" inspection system, or for 100% coverage of dense patterns.

SUMMARY OF THE INVENTION

An overall object of the present invention is to provide a method and system which utilizes an angled scanning beam of energy to provide diverse inspection capability so as to check leads (which may be bare copper or tinned), pads, solder paste (which has no substantial specular reflection component), and leads placed in solder paste prior to the reflow process (prior to forming solder fillets). The diagonally scanned system can also be used to obtain useful information about solder fillets and the dimensions of conductor trace patterns.

Another object of the present invention is to provide a method and system which, in turn, provide improvements in three dimensional inspection of objects sparsely arranged in a series of rows and columns with the use of a non-orthogonal coordinate system introducing symmetry for scanning of rows and columns, thereby eliminating a requirement for dynamic rotation of the part or imaging head (and associated errors) during operation, or the use of multiple sensors and scanners (or projectors) for orthogonal views.

Still another object of the present invention is to provide a method and system which allows for efficient scanning of patterns like IC leads, bonding sites, pads and bumps on microelectronic assemblies ranging from bumped wafers to PCBs, and other miniature industrial parts and patterned assemblies arranged in rows and columns.

Another object of the present invention is to provide a method and system which further improves the scan efficiency by the use of an addressable beam deflector thereby limiting data acquisition only to regions of interest, and allowing for variable scan speed in either of two chosen orthogonal directions. The object is to approach data acquisition performance (effective line rates) which may substantially exceed video rates, thereby allowing for increasing the resolution for inspection while meeting cycle time requirements.

Still another object of the present invention is to provide a scanning method which minimizes "dead time" when changing scan directions while also alleviating requirements for rapid acceleration of the imaging head or part to be inspected.

Another object of the present invention is to provide a method and system which improves the measurement accuracy of 3-D systems used for microelectronic package inspection by utilizing a scan method which reduces the effect of obstruction and spurious secondary reflections along the sensor axis (FIG. 7) associated with typical lead and body geometries, particularly when inspected "in-tray".

Still another object of the present invention is to provide a method and system which reduces the number of data points produced by specular reflections, thereby limiting the required sensor dynamic range.

Another object of the present invention is to provide a method and system which improves the reliability and accuracy of the measurement system by providing a consistent lead orientation, thereby alleviating data reduction requirements.

In carrying out the above objects and other objects of the present invention, an improvement is provided in a method for the automated high-speed, triangulation-based, 3-D imaging of an object at a vision station to develop dimensional information associated with the object. The object has a first set of inspection sites. The method includes the steps of scanning a focused beam of radiant energy to create a scanning beam in the form of a scan line having a predetermined orientation and to create a plurality of spots at a plurality of points on corresponding surfaces of the first set of inspection sites and relatively translating the scanning beam with respect to the first set of inspection sites in a first direction defining a first axis of motion to generate corresponding reflected light signals. The method also includes the steps of sensing the amount of energy in the reflected light signals to generate corresponding electrical signals and processing the electrical signals to obtain a first set of data representing the dimensional information, including the heights of the plurality of points on the corresponding surfaces. The improvement is that the predetermined orientation of the scan line is at a predetermined acute angle with respect to the first direction.

Preferably, the method further includes the step of relatively translating the scanning beam with respect to a second set of inspection sites of the object in a direction substantially orthogonal to the first direction and defining a second axis of motion.

Also preferably, the predetermined acute angle is approximately 45°.

Further in carrying out the above objects and other objects of the present invention, a system is provided which carries out the above method steps.

Typical inspection systems, whether utilizing a camera array or line scan system, acquire data in a system of orthogonal Cartesian coordinates (X,Y,Z). Although the orthogonal system is customary, it is not necessarily optimum. Exceptions do exist. For example, visible and infrared airborne scanners sometimes utilize rotating wedges to generate a series of scanning fields of view (which can be a single point or image) described by a series of parametric equations of motion for each of the deflectors. Many scan patterns producing variable angular coverage can be generated using such a system.

The invention disclosed here is a scanning method for exploiting the regularity of inspection sites sparsely arranged in rows and columns, if such regularity is present. If 100% inspection of dense patterns is required, the system is dynamically configured with an increased scan line length to acquire data in usual "serpentine" fashion. Scanning axes correspond to both positive and negative directions along two orthogonal directions.

Figure 9:
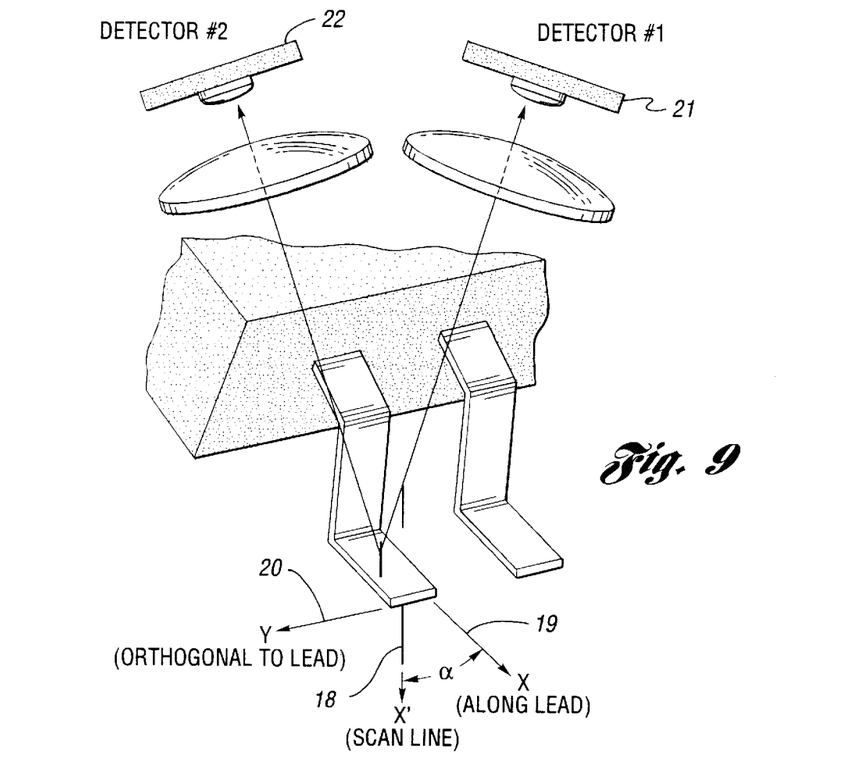
FIG. 9 is an enlarged perspective view, partially broken away, of a preferred coordinate system of the present invention for inspection of many semiconductor patterns.

In accordance with the practice of the present invention, symmetry in the horizontal and vertical directions, otherwise lacking in a triangulation-based line scan system, is introduced for inspection of rows and columns arranged in an orthogonal pattern. FIG. 9 schematically illustrates a triangulation-based laser line scan system (X', Y, Z) where the X' axis 18 is parallel to the scanning beam and preferably rotated 45° with respect to the orthogonal reference coordinate system 19,20. The preferred detection system utilizes two receivers arranged to be symmetric about the scanning point at any instant, providing received beams and subsequent electronic signals which are substantially matched in space, and invariant with respect to the position of the scanning spot along the X' direction. Details of the preferred optical system for each of the receivers is disclosed in U.S. Pat. No. 5,024,529, including light delivery means for detectors 21,22.

An addressable beam deflector is used to allow for variable line length scans so as to provide capability ranging from 100% inspection area coverage to single or multiple regions of interest corresponding to a small section of the available scanner field of view.

Figure 10A:
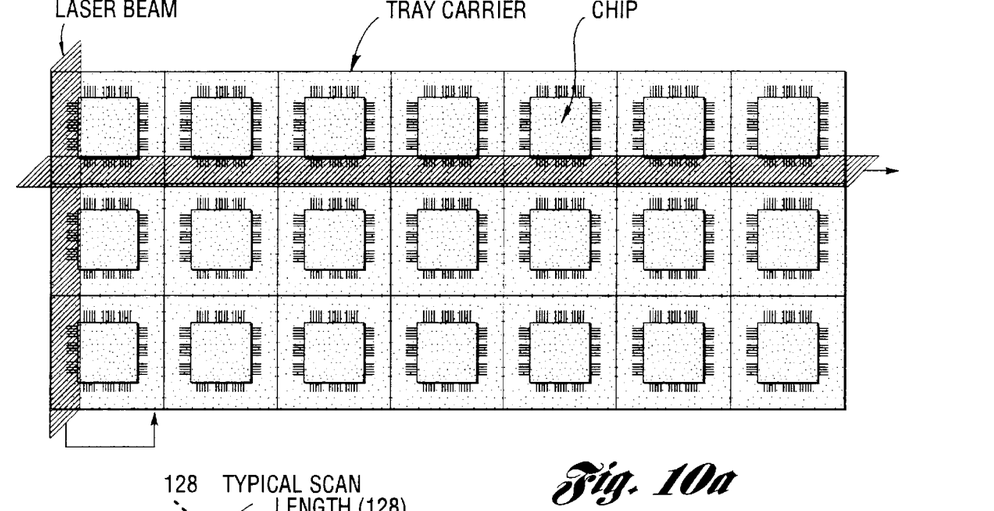
FIG. 10a is a top plan view illustrating a scanning path for "in-tray" inspection of IC leads of the present invention.
Figure 10B:
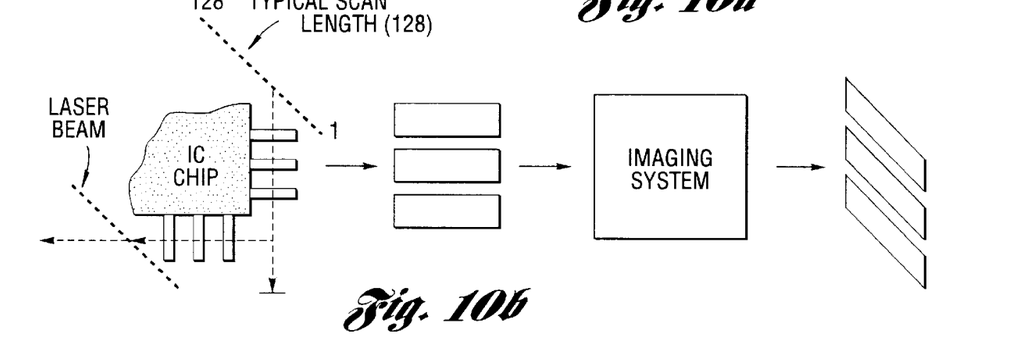
FIG. 10b is a schematic block diagram of the system of the present invention.
Figure 11A:
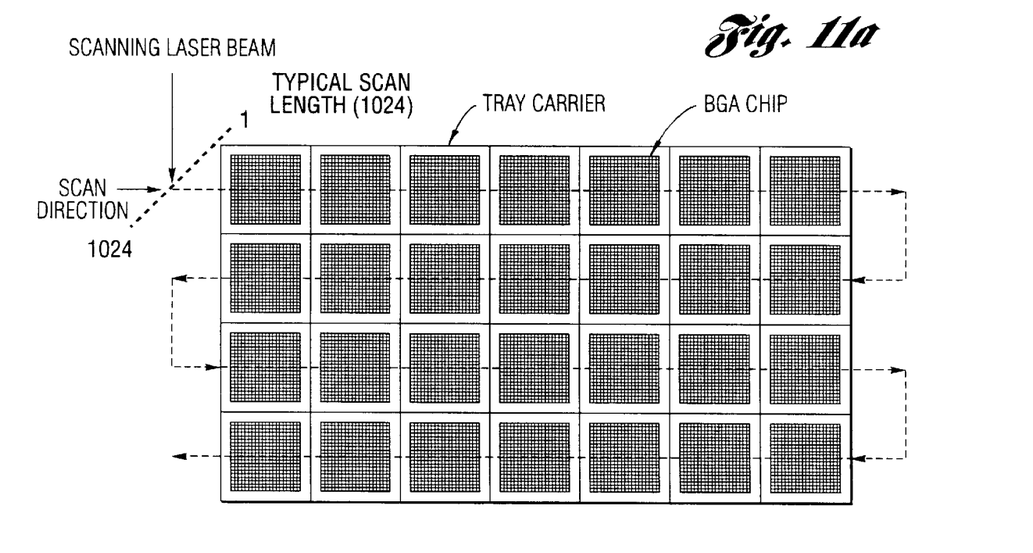
FIG. 11a is a view similar to FIG. 10a for "in-tray" inspection of BGA's of the present invention.
Figure 11B:
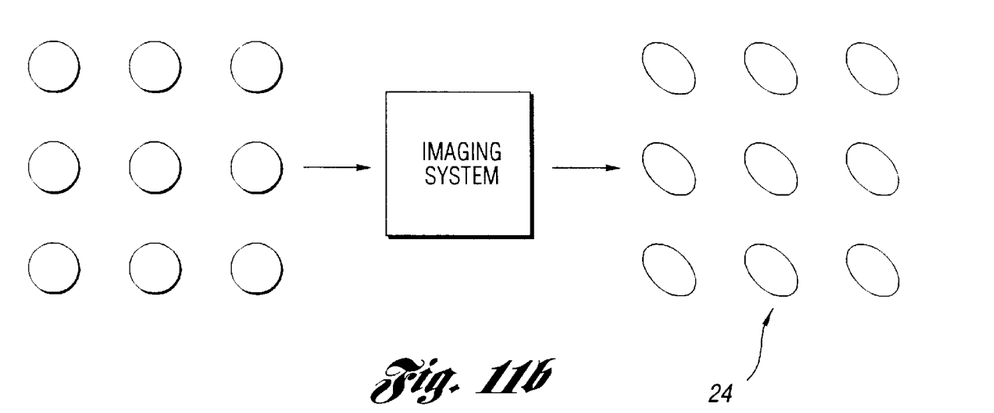
FIG. 11b is a view similar to a combination of FIGS. 10a and 10b for BGA's of the present invention.

The system incorporating the invention utilizes programmable X,Y motion stages to generate the scan pattern results illustrated in FIGS. 10–11. Two extreme cases, representing diverse inspection requirements, are shown: (i) lead tip inspection where the IC body and background is ignored, and (ii) BGA inspection or bumped die which requires scanning nearly 100% of the inspection area. An addressable high speed deflector is programmed to optimize the scan efficiency for inspection requirements ranging from lead and pad sites through 100% inspection of dense patterns.

The above objects and other objects, features, and advantages of the present invention are readily apparent from the following detailed description of the best mode for carrying out the invention when taken in connection with the accompanying drawings.

BEST MODE FOR CARRYING OUT THE INVENTION

In general, the method and system of the invention relates to the use of triangulation-based linear line scan systems for three-dimensional automated inspection. Objects to be inspected or measured, typically microelectronic circuit patterns or packages, may be arranged in sparse, regular patterns or in a dense nearly random arrangement. A typical sparse pattern is an arrangement of leads on an integrated circuit package where the leads are located on the sides of a rectangular region, or a series of solder bumps or bonding sites on a wafer arranged in a grid pattern of rows and columns. On the other hand, a fine pitch interconnect pattern or irregular arrangement of traces represent a dense pattern. Likewise, the parts may be transported to the inspection system in a tray, or one at a time by perhaps a wafer or component handler.

The invention disclosed herein is a scanning method implemented in a non-orthogonal coordinate system which introduces the symmetry needed for inspection of sites arranged along the periphery of a rectangle without the use of dynamic rotation means or multiple cameras and lines of light. The configuration also greatly reduces the occurrence of spurious data points resulting from occlusion and reflections. The high speed scanning system utilizes a deflector having fast access time which can be addressed for variable scan line length programming so the field of view can be optimized for either dense or sparse pattern inspection, thereby maximizing a figure of merit including both inspection, speed and accuracy.

In general, FIGS. 1–6 illustrate variations in inspection requirements which impact the speed and magnification requirements of the inspection system. FIGS. 7–8 illustrate important issues affecting accuracy of triangulation-based systems. FIGS. 9–11 illustrate the key elements of the invention developed to provide improvements in data acquisition, speed and accuracy, and an exemplary embodiment in a practical semiconductor inspection unit in FIG. 12. The utility of a high speed, addressable deflector is shown in FIG. 13.

In particular, FIG. 1 shows a typical microelectronic assembly requiring 100% coverage for detection of random defects, measurement of height and lateral dimensions of conductor patterns, and verification of component placement. A combination of perfectly registered intensity (or color) and height information is ideal for maximizing overall inspection capability.

Figure 2:
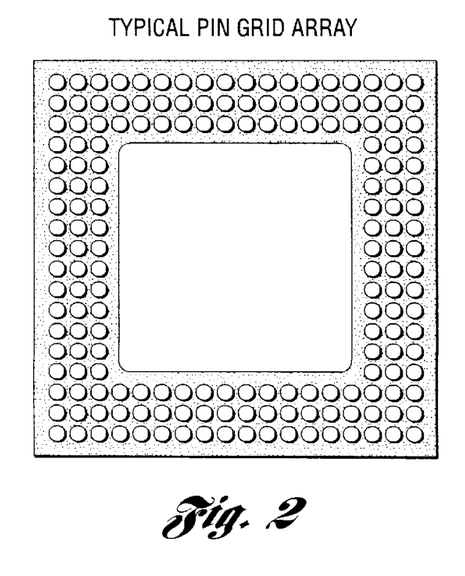
FIG. 2 is a view of a typical pin grid array (PGA)

FIG. 2 shows a 2"×2" pin grid array (PGA) used for state-of-the-art microprocessors. The pins (circles) extend upward (out of the page) from the substrate. The pin tips must be in the same plane (coplanar) and free of compound bends. Similar arrangements are found for solder ball grid arrays (BGAs) and for wire bonding pads.

Figure 3:
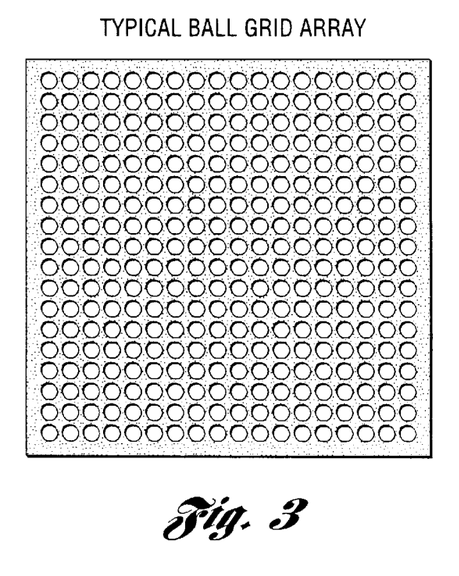
FIG. 3 is a view of a typical ball grid array (BGA)

FIG. 3 shows a typical ball grid array (BGA) or, at a finer scale, bumped wafer. A typical array in production today will have about 225 sites per square inch. However, density is increasing with technological advances, resulting in a bumped wafer technology demonstrated with about 12,000 sites per square inch. This presents extraordinary demands for sensor speed and accuracy. The system configuration may be either "in-line" (where one part is presented to be inspected at a time with a handler), or "in-tray" where many BGAs or bumped die, encompassing many thousand inspection sites, are inspected in with 100% coverage of the tray.

Figure 4:
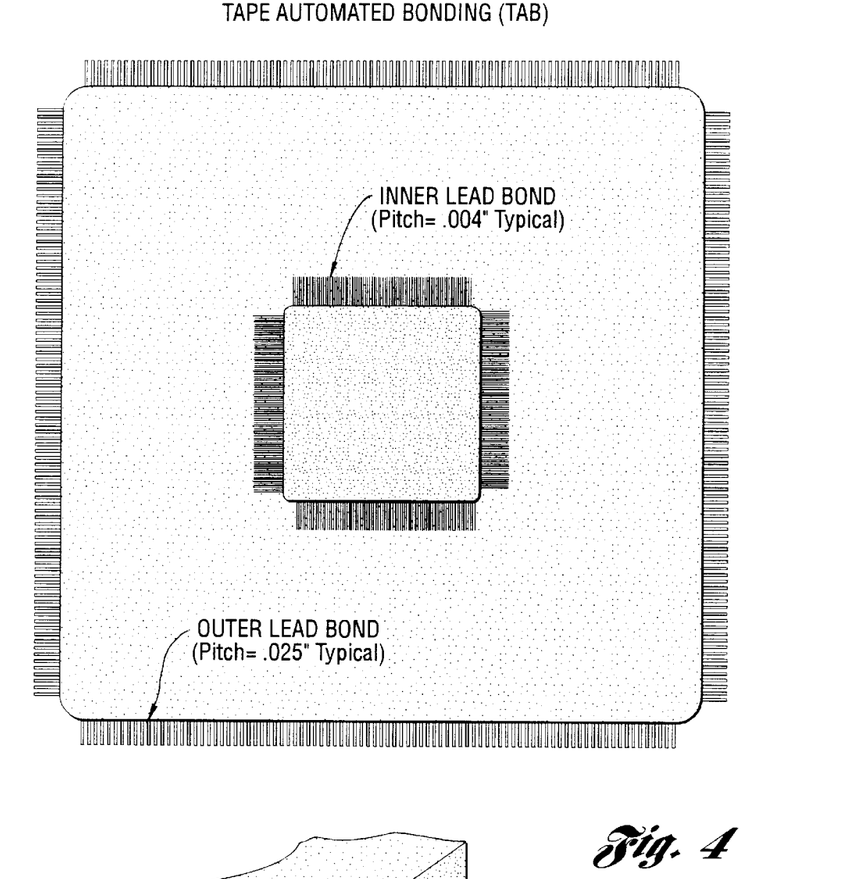
FIG. 4 is a view of an interconnect pattern for tape automated bonding (TAB)

FIG. 4 shows an interconnect pattern for tape automated bonding (TAB). Important inspection criteria include alignment of the lead to the pad and lead coplanarity. Current inner lead bond patterns have leads and spaces as fine as 0.003". High accuracy and resolution are required in the "region of interest". A similar layout is often found for wire bonding and bumped die technologies.

Figure 5:
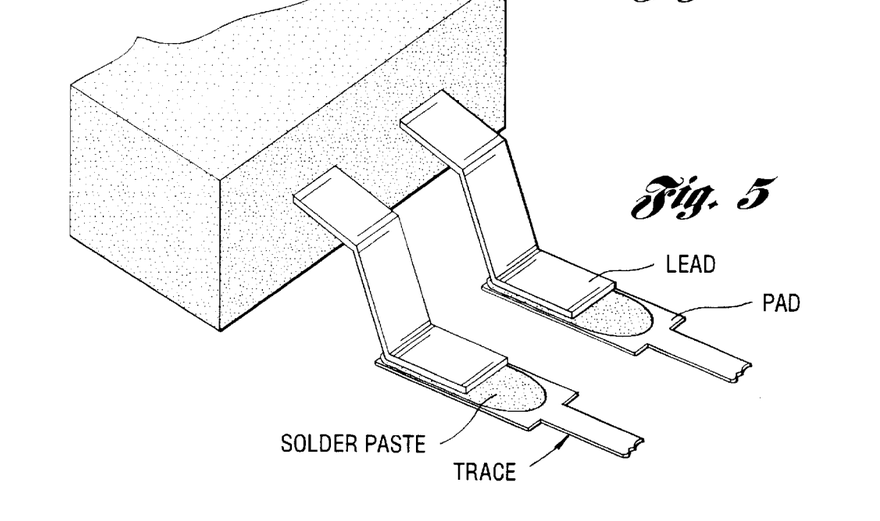
FIG. 5 is an enlarged perspective view partially broken away, of a generic lead-to-pad requirement.

FIG. 5 shows a "close-up" view of generic lead to pad requirement, which, in addition to TAB, can also be found in PCB manufacturing. The alignment of the lead to pad, paste and lead thickness determine solder joint integrity. Relatively high magnification is required, and it is important to have image resolution concentrated in the areas of interest.

Figure 6:
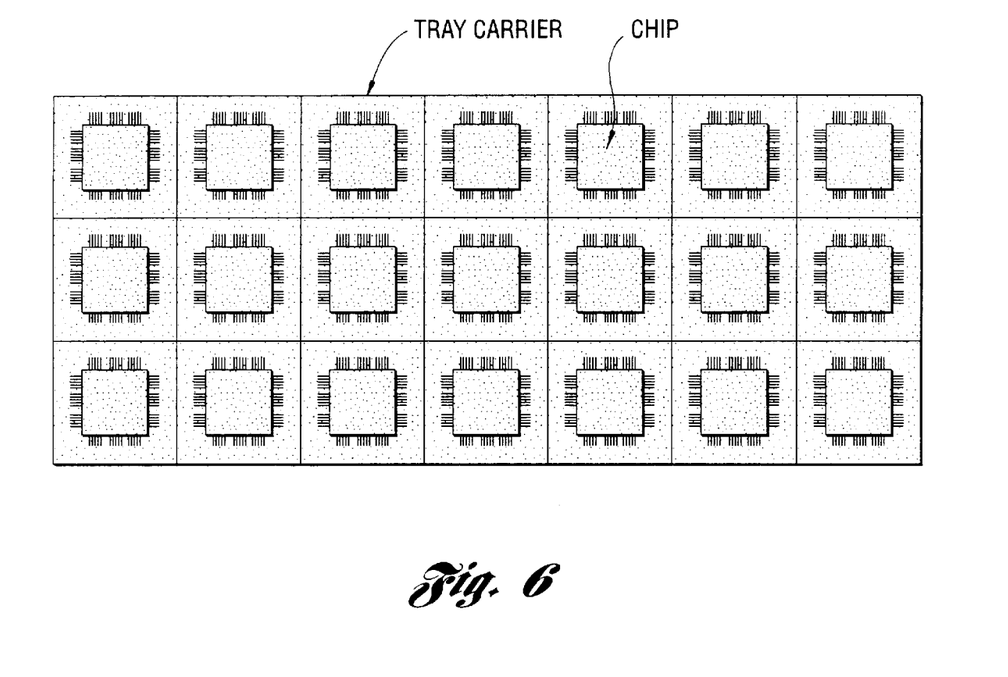
FIG. 6 is a top plan view illustrating an arrangement of ICs in a tray.

FIG. 6 shows an arrangement of ICs in a tray. The objects to be inspected in a typical semiconductor manufacturing operation may be IC leads, BGAs or PGAs. It is important to achieve 100% inspection of leads or bonding sites. The pattern may be sparse (lead tips) or dense (BGA or bumped die). Inspection systems must be configured to efficiently handle any case which may arise.

FIG. 7 illustrates anomalies which arise in triangulation-based systems which are configured such that the instantaneous field of view allows secondary specular reflections along the position (depth) sensing axis to be accepted. The lead finish need not approach a perfect mirror to allow the secondary reflection energy to be competitive with the signal obtained from the point of interest. The interference is greatly attenuated when the viewpoint is shifted to a diagonal or orthogonal position. A second sensor "above" the chip may have the line of sight blocked (occlusion) if the viewing angle is too wide.

FIG. 8 shows similar effects (circularly symmetric) occur on BGAs and bonding pads which require multiple sensors. Ambiguities cannot be resolved with any single viewpoint because of the circular symmetry. This type of problem is best solved with multiple sensors and associated logic and numeric transforms to filter anomalies resulting from occlusion, self-shading, specular reflection, and multiple reflections.

FIG. 9 shows a preferred coordinate system for inspection of many semiconductor patterns and assemblies. There is symmetry along the horizontal and vertical directions which allows for efficient scanning of rows and columns without a requirement for a rotary mechanism or multiple cameras and projectors. Programmable scan widths allow for improvement in throughput when the region of interest is restricted. This orientation overcomes the problems illustrated in FIG. 7 (lead inspection). The specular reflection and strong secondary specular components are directed away from the sensor. Occlusion effects are reduced when compared to data collected with the usual serpentine scanning method.

FIG. 10a shows the scanning path for "in-tray" inspection of IC leads for a representative raw and column. Inspection of lead tips reduces the field of view requirement resulting in a substantial increase in the data rate. The "close-up" illustration of FIG. 10b shows the transformation introduced by the sensor when scanning IC leads, a sparse pattern. The field of view is programmed in this example to cover 128 scan elements (1024 typically available with deflector) allowing for an eight-fold increase in table scan velocity (approaches mechanical limit).

FIG. 11a shows the scanning path for "in-tray" inspection of BGAs effectively requires 100% coverage of the tray. FIG. 11b shows the transformation introduced by the sensor when BGAs are imaged. The BGA pattern is dense and the entire 1024 field of view is examined. With a wide field of view, the overhead and rapid accelerations associated with multiple passes (i.e. one scan per row) is avoided resulting in substantial improvements in data rates (scan efficiency), and imaging system (electronic capture rate) limited performance as opposed to mechanical limitations. Orthogonal scans are not required because of the circular symmetry and the density of inspection points.

Figure 12:
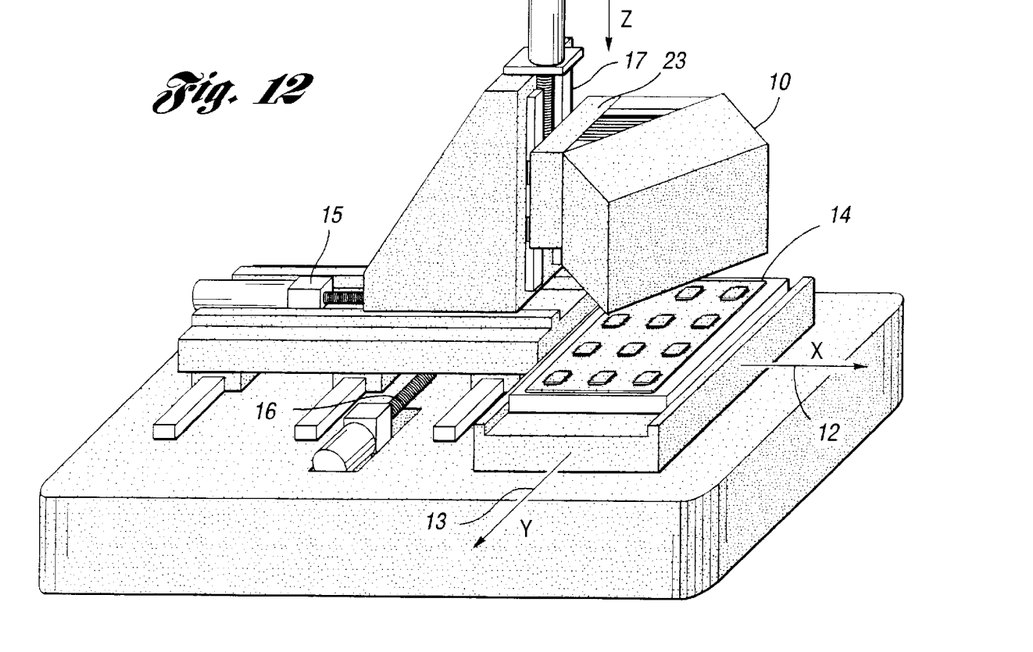
FIG. 12 is a schematic, perspective view of the system of the present invention with a scan head in a transformed coordinate system.
Figure 13:
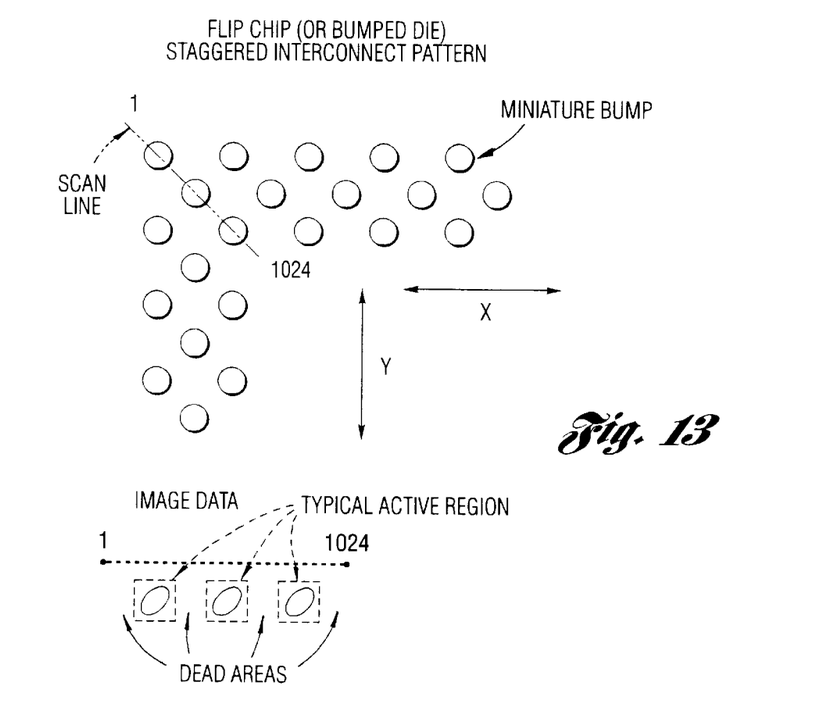
FIG. 13 is a schematic view illustrating the utility of using an addressable scanning mechanism.

FIG. 12 shows a scan head in a transformed coordinate system integrated into one type of semiconductor inspection system. The imaging system is mounted with the Z axis perpendicular to the inspection stage and the X' axis rotated 45° with respect to the nominal X,Y inspection plane.

In particular, FIG. 12 shows an imaging head 10 mounted at a 45° angle with respect to the orthogonal X-Y inspection reference axes 12 and 13. In this example, a tray of parts 14 containing integrated circuit devices are to be scanned, and information is to be obtained from the lead tips. Alternatively, the tray may contain BGAs or bumped die which represent a dense pattern requiring effectively 100% coverage, but at somewhat slower inspection rates.

In many applications, it is preferred to avoid movement (particularly rapid acceleration) of the object to be inspected. The imaging head 10 is translated with X,Y motion stages 15 and 16 above (or below) the part. A precision motion servo system which can be programmed for different speeds is preferred with precision of finer than 1 $\mu$m for the X,Y,Z axes. The Z axis motion stage 17 is also incorporated as a convenient means of handling the ultimate tradeoff between the depth range of the imaging system and part flatness specifications.

The imaging head 10 incorporates a beam deflector, telecentric transitter and receiver optics, and position sensitive detectors to derive the depth information from the triangulation principle as described in U.S. Pat. No. 5,024,529. In addition to height information, the sensor also produces perfectly registered grey scale (laser intensity) data similar to that which would be obtained with standard video camera. The scanning laser beam is typically incident in a direction perpendicular to the X,Y inspection surface (i.e. parallel to the Z axis). For applications approaching video rate (>1 Mhz sampling), the beam deflection mechanism may be a rotating polygon mirror, hologon, resonant scanner, or acousto-optic deflector. However, acousto-optic deflection provides fast retrace (high duty cycle), is addressable, and can be synchronized externally to vary the effective scan rate over a wide range. For variable line width scanning such deflectors provide very high scan efficiency when compared to any rotating mirror system.

In normal operation, a translation stage is used to move the part or imaging head in a single Y axis, and acousto-optic beam deflection is used for high speed (i.e. quasi-video) scanning along the X' axis. When orthogonal scans are needed (i.e. scanning the sides of a square), the stage motion is first directed along one of two axes (X or Y, positive and/or negative directions). When changing to an orthogonal direction, the X' axis remains fixed and the function of the X and Y (stage motion) axes are interchanged.

The scanning axis X' 18 is set at a nominal 45 degree angle (i.e. α) with respect to the system X and Y axes as shown in FIG. 9 at reference numerals 19 and 20, respectively. The imaging head 10, which in this case incorporates two substantially identical receivers 21 and 22 to eliminate occlusion and reduce spurious data, is attached to a machined wedge plate, and the assembly is mounted on the Z axis plate 23. This allows for modularity and for the use of the imaging head in other applications where a standard orthogonal Cartesian system is desired. Alternatively, it is possible to design a Z-axis plate with the 45 degree wedge "built in." This method could have an advantage of requiring less assembly time which could be advantageous for large volume applications, but is somewhat more bulky. Likewise, it is possible to arrange combinations of optical components including mirrors and prisms in many ways to change the "form factor" of the imaging head. Calibration software is available to remove any static (normal tolerance stackup) errors in the 45 degree mount (and is applicable to any orientation).

One limitation to consider with the approach is the 40% foreshortening (projection onto the X or Y axis) of the scan line. Provided that a high speed imaging system (i.e. quasi-video rates, >1 Mhz) is used, the scan line length can be increased to mitigate the tradeoff, without sacrificing spatial resolution. For example, if the basic sensor data rate is 10 Mhz, the effective data rate will be approximately 7 Mhz. Use of an AO deflector with an increased number of spots (say, 1024) also improves the scan efficiency, provided that the system allows for dynamic selection of fewer spots (say, 32 minimum for lead tip inspection).

FIG. 13 illustrates the utility of an addressable scanning mechanism for avoiding "dead areas" and exploiting the regularity of inspection sites. Such patterns are often found on BGAs or bumped wafers.

In particular, FIG. 13 further illustrates the utility of the addressable beam deflector (contained within the Imaging Head) with a large number of spots, assuming the "access time" is relatively short. With acousto-optic deflectors there are limitations on the scan rate when scan locations are taken at random or non-consecutively (often called "fill time" or "aperture time"). A typical deflector might have an aperture time of 25 microseconds and a related number of resolvable spots. If the arrangement of inspection sites along a scan line is sparse, the "dead areas" can be ignored (with a delay corresponding to the "aperture time" for each) and the regions of interest scanned (at high speed).

Suppose the rows and columns of a staggered bumped wafer pattern are to be scanned in the non-orthogonal system, and the regions of interest are to be restricted to the vicinity of the bumps. If 1000 spots are available and the data rate is 5 Mhz (200 nanoseconds/sample), the scan time for each line is 225 microseconds (including 25 microseconds of "aperture time"), representing a line rate of 4444/second. If the effective inspection time required for regions of interest is much less than the 225 microsecond line time then the 25 microsecond delay in "jumping" to the next region of interest may be insignificant. For example, if 3 sites are present requiring 64 pixels for inspection, the effective line rate may be approximately doubled (8817 lines/second) even with fast scan rates where the "aperture time" became substantially a fraction of line rate computation, as found with the "retrace time" associated with standard video systems.

An additional advantage of this approach is alleviation of the requirements for mechanical stage motion and the associated rapid accelerations associated with a limited sensor field of view (i.e. sensor field of view limited to 64 pixels or one bump). The speed of the motion system would necessarily be at least three times greater considering that there is overhead associated with stopping, moving to the next column (row) etc. Translation stages which simultaneously satisfy the requirements for speed and accuracy for several microelectronic inspection applications may not be practical.

In addition to inspection speed, there are several considerations deserving attention for microelectronic inspection. As can be seen from FIGS. 7–8, a narrow triangulation angle is preferred to avoid occlusion. For inspection of IC leads mounted in trays, a viewing angle less than about 20 degrees is preferred. In triangulation, there is an inherent tradeoff between depth resolution and the viewing angle. The embodiment described in U.S. Pat. No. 5,024,529 describes a technique which provides for a system with fine depth resolution over an extended field of view while avoiding a requirement for moving parts, as would be required with the "synchronized scanning" approach familiar to those versed with 3-D scanning technologies. As a result, the resolution is substantially better than what is available with camera based structured light systems.

The data processing system is required to determine dimensional information from the 3D and grey scale data. Typical parameters include coplanarity of leads or solder bumps, width/diameter measurements, volume/area of solder paste, and defect detection. A transformation on data 24 (i.e. FIG. 11b) obtained from the (X',Y,Z) coordinate system is performed in the hardware and software by transfer of data to the processor, which incorporates a high speed Central Processing Unit (CPU) like the Intel Pentium Processor. Standard mathematical formulae used to transform from the (X',Y,Z) system are supplemented with calibration tables for X and Z locations, and velocity information provided by the motion system, is correct for both static and dynamic system variations. Included in such correction is a geometric transformation to account for changes in the Y' position as a function of the Y scan velocity. This is important because the scan rate is increased as the window size is decreased, and the effective tilt of scan lines will vary. Furthermore, pixel locator modules are included to locate features within the regions of interest to account for random errors in placement and part location.

Those skilled in the art will recognize that there are several variations of the method and system of the above-described invention which can be implemented within the spirit of the invention. For example, the beam deflector could be replaced by a projected line of light, and the high speed position sensitive photodiodes with a pair of 32×32 arrays, resulting in a maximum line rate of 15000 lines/second acquired, but with the understanding that the field of view is restricted to 32 points (about 22 effective points with foreshortening). The best method for implementing the invention will allow for scanning a much wider field of view at approximately the same 15000 line rate thereby producing substantially different overall inspection results: 100% coverage at or near production rates.

The imaging system will include means for extracting locations of features from reference data (i.e. CAD), means for sub-dividing scan length into at least one pre-defined segment, generating scan so as to collect data from regions of interest thereby reducing acquisition time by ignoring "dead areas".

Scanned objects may be leads, bonding sites, traces, or patterns of bumps on wafers. The scanning methods exploit the regularity of many of these objects. Some objects (i.e. PQFP leads, pads) will have a "major axis" and the table motion is orthogonal to the major axis. The inspection sites may have arbitrary shapes but are often arranged in a repetitive grid pattern. Often the objects will be along the periphery of a square or rectangle.

"BGA (Ball Grid Array) inspection" will be done in the same system, the laser scan will be oriented diagonally with respect to the BGA package, but scanning is only required along the first direction. There is no advantage to multiple scans with dense array (i.e. the pattern for BGA is 1:1 aspect, dense, and not orientation sensitive).

For BGA inspection or inspection of a similar regular but sparse patterns of inspection sites a "Plurality of Points" may be obtained through electronic windowing with a solid state deflector to ignore multiple areas having no inspection sites (i.e. "jumping" between multiple regions). "Detection & signal processing means" may include multiple detectors.

Parts may be Microelectronic assemblies "in-tray" (as illustrated in FIG. 12) resulting in inspection of a "batch of parts" or "in-line" where one part is inspected and loaded each time. For one "in-line" configuration, FIG. 12 could be modified such that the part is translated using the following options.

Options for scanning (translation stage):
The beam may be translated in one direction, the part in the other;
The part may be scanned in both directions with the beam stationary;
The beam may be translated in both directions.

The translation stage may be replaced with beam deflectors. The translation stage travel may be as small as a fraction of an inch to full tray size (typically 15" maximum) or larger. For example, an alternate embodiment for bumped die inspection would result in replacement of the tray transport by a part handler which would load the part to be inspected onto an X,Y stage assembly. The X,Y stages 12,13 transporting the imaging head 10 in FIG. 12 could be replaced by miniature X,Y stages transporting the parts along the orthogonal axes, while the imaging head 10 remains attached to the Z axis 17. The supporting base would be of the same basic design but the size of the inspection system could be greatly reduced with this alternate embodiment.

The scanner focused spot diameter will range from a fraction of a micron for bumped or patterned wafers to larger than 0.001" for coarse pitch leads.

The beam incident angle may be perpendicular to the surface (as illustrated) with detectors off-axis, or incident at an angle with at least one receiver oriented at equal angle (in specular illumination and viewing). Such a configuration is advantageous for certain surface inspection applications.

The laser system may have Automatic Light Control so as to control exposure for different part types.

The stage speed may be as slow as 0.05"/second for inspection at high magnification to 20"/second for coarser inspection.

For example, for inspection of the TAB assembly (FIG. 4), the inner lead bond area would be scanned at a rate of about 0.25–0.5 inches/second using the symmetric scanning arrangement only along rows and columns. When scanning the outer lead bond areas, the scan speed of the X,Y stages can be increased four fold to rapidly inspect the coarser 25 mil pitch leads. The savings in time for windowing and the angled scan with orthogonal symmetry is very evident in this case.

The processing means may include a hardware method for coordinate transformation from the non-orthogonal coordinate system into X,Y coordinates.

A third axis (Z axis in Figure) may be used allowing for inspection of lead tips, standoff, and shoulder in one or more scans, or for expanding the working depth range without compromising depth resolution.

Preferably, the viewing angle is "narrow", in range of 15°, to 45°.

Also, preferably, the sensor data rate is in the range of 1 MHz to 20 MHz.

While the best mode for carrying out the invention has been described in detail, those familiar with the art to which this invention relates will recognize various alternative designs and embodiments for practicing the invention as defined by the following claims.

What is claimed is:

1. In a method for the automated high-speed, 3-D imaging of an object at a vision station to develop dimensional information associated with the object, the object having a first set of inspection sites, the method including the steps of projecting a focused beam of energy having a predetermined orientation to create a plurality of points on corresponding surfaces of the first set of inspection sites and relatively translating the focused beam with respect to the first set of inspection sites in a first direction defining a first axis of motion to generate corresponding reflected signals, sensing the amount of energy in the reflected signals to generate corresponding electrical signals and processing the electrical signals to obtain a first set of data representing the dimensional information, including the heights of the plurality of points on the corresponding surfaces, the improvement comprising:

the predetermined orientation of the beam of energy is at a predetermined acute angle with respect to the first direction and wherein the step of translating occurs during the step of projecting.

2. The method as claimed in claim 1 further comprising the step of relatively translating the focused beam with respect to a second set of inspection sites of the object in a direction substantially orthogonal to the first direction and defining a second axis of motion.

3. The method as claimed in claim 1 wherein the predetermined acute angle is approximately 45°.

4. The method as claimed in claim 1 wherein the first set of data is in a non-orthogonal coordinate system and wherein the method further comprises the step of transforming the first set of data into a second set of data in an orthogonal coordinate system.

5. The method as claimed in claim 1 wherein the first set of inspection sites are electrical interconnection sites.

6. The method as claimed in claim 1 wherein the first set of inspection sites are electrical interconnections.

7. The method as claimed in claim 1 wherein the object is an electrical component.

8. The method as claimed in claim 1 wherein the plurality of points is adjustable.

9. The method as claimed in claim 8 wherein the plurality of points is adjustable in a range of 32 to 1024.

10. The method as claimed in claim 1 wherein the rate at which the first set of data is obtained is based on the speed at which the focused beam of energy is relatively translated along the first axis of motion.

11. The method as claimed in claim 1 wherein the beam of energy is a beam of radiant energy.

12. In a system for the automated high-speed, 3-D imaging of an object at a vision station to develop dimensional information associated with the object, the object having a first set of inspection sites, the system including means for projecting a focused beam of energy having a predetermined orientation to create a plurality of spots at a plurality of points on corresponding surfaces of the first set of inspection sites, means for relatively translating the focused beam with respect to the first set of inspection sites in a first direction defining a first axis of motion to generate corresponding reflected signals, means for sensing the amount of energy in the reflected signals to generate corresponding electrical signals and means for processing the electrical signals to obtain a first set of data representing the dimensional information, including the heights of the plurality of points on the corresponding surfaces, the improvement comprising:

the predetermined orientation of the beam of energy is at a predetermined acute angle with respect to the first direction and wherein the means for translating translates the beam during creation of the beam.

13. The system as claimed in claim 12 wherein the means for relatively translating also relatively translates the focused beam with respect to a second set of inspection sites of the object in a direction substantially orthogonal to the first direction and defining a second axis of motion.

14. The system as claimed in claim 12 wherein the predetermined acute angle is approximately 45°.

15. The system as claimed in claim 12 wherein the first set of data is in a non-orthogonal coordinate system and wherein the system further comprises means for transforming the first set of data into a second set of data in an orthogonal coordinate system.

16. The system as claimed in claim 12 wherein the first set of inspection sites are electrical interconnection sites.

17. The system as claimed in claim 12 wherein the first set of inspection sites are electrical interconnections.

18. The system as claimed in claim 12 wherein the means for translating includes a 3-D laser scanner, the means for sensing includes an image sensor and the means for processing includes an image processing system.

19. The system as claimed in claim 18 wherein the 3-D laser scanner is mounted on a positioning system at the predetermined acute angle and wherein the positioning system moves the 3-D laser scanner relative to the object.

20. The system as claimed in claim 12 wherein the means for projecting includes an adjustable beam deflector for adjusting the plurality of points.

21. The system as claimed in claim 20 wherein the plurality of points is adjustable in a range of 32 to 1024.

22. The system as claimed in claim 12 wherein the means for relatively translating moves the object with respect to the means for projecting.

23. The system as claimed in claim 12 wherein the beam of energy is a beam of radiant energy.

24. The system as claimed in claim 12 wherein the data is 3-D data and wherein the system is triangulation based.

25. The system as claimed in claim 12 wherein the data is 3-D data and wherein the system is line-scanned based.

26. In a method for the automated high-speed, 3-D imaging of an object at a vision station to develop dimensional information associated with the object, the object having a first set of inspection sites, the method including the steps of projecting a focused beam of energy having a predetermined orientation to create a plurality of points on corresponding surfaces of the first set of inspection sites and relatively translating the focused beam with respect to the first set of inspection sites in a first direction defining a first axis of motion to generate corresponding reflected signals, sensing the amount of energy in the reflected signals to generate corresponding electrical signals and processing the electrical signals to obtain a first set of data representing the dimensional information, including the heights of the plurality of points on the corresponding surfaces, the improvement comprising:

determining locations of the first set of inspection sites; and adjusting the plurality of points based on the locations whereby data acquisition is limited only to regions of interest and wherein the step of translating occurs during the step of protecting.

27. The method as claimed in claim 26 further comprising the step of relatively translating the focused beam with respect to a second set of inspection sites of the object in a direction substantially orthogonal to the first direction and defining a second axis of motion.

28. The method as claimed in claim 26 wherein the predetermined orientation is at a predetermined acute angle with respect to the first direction.

29. The method as claimed in claim 26 wherein the first set of data is in a non-orthogonal coordinate system and wherein the method further comprises the step of transforming the first set of data into a second set of data in an orthogonal coordinate system.

30. The method as claimed in claim 26 wherein the first set of inspection sites are electrical interconnection sites.

31. The method as claimed in claim 26 wherein the first set of inspection sites are electrical interconnections.

32. The method as claimed in claim 26 wherein the object is an electrical component.

33. The method as claimed in claim 26 wherein the plurality of points is adjustable in the range of 32 to 1024.

34. The method as claimed in claim 26 wherein the first set of inspection sites are regularly arranged but sparse patterns.

35. The method as claimed in claim 26 wherein the first set of inspection sites are dense patterns.

36. The method as claimed in claim 26 wherein the rate at which the first set of data is obtained is based on the speed at which the focused beam of energy is relatively translated along the first axis of motion.

37. In a system for the automated high-speed, 3-D imaging of an object at a vision station to develop dimensional information associated with the object, the object having a first set of inspection sites, the system including means for projecting a focused beam of energy having a predetermined orientation and to create a plurality of spots at a plurality of points on corresponding surfaces of the first set of inspection sites, means for relatively translating the focused beam with respect to the first set of inspection sites in a first direction defining a first axis of motion to generate corresponding reflected light signals, means for sensing the amount of energy in the reflected light signals to generate corresponding electrical signals and means for processing the electrical signals to obtain a first set of data representing the dimensional information, including the heights of the plurality of points on the corresponding surfaces, the improvement comprising:

means for determining locations of the first set of inspection sites and wherein the means for projecting includes means for adjusting the plurality of points based on the locations whereby data acquisition is limited only to regions of interest and wherein the means for relatively translating translates the focused beam during creation of the focused beam.

38. The system as claimed in claim 37 wherein the means for relatively translating also relatively translates the focused beam with respect to a second set of inspection sites of the object in a direction substantially orthogonal to the first direction and defining a second axis of motion.

39. The system as claimed in claim 37 wherein the predetermined orientation is an acute angle with respect to the first direction.

40. The system as claimed in claim 37 wherein the first set of data is in a non-orthogonal coordinate system and wherein the system further comprises means for transforming the first set of data into a second set of data in an orthogonal coordinate system.

41. The system as claimed in claim 37 wherein the first set of inspection sites are electrical interconnection sites.

42. The system as claimed in claim 37 wherein the first set of inspection sites are electrical interconnections.

43. The system as claimed in claim 37 wherein the means for translating includes a 3-D laser scanner, the means for sensing includes an image sensor and the means for processing includes an image processing system.

44. The system as claimed in claim 43 wherein the 3-D laser scanner is mounted on a positioning system at a predetermined acute angle with respect to the first direction and wherein the positioning system moves the 3-D laser scanner relative to the object.

45. The system as claimed in claim 37 wherein the means for projecting includes an adjustable beam deflector for adjusting the plurality of points.

46. The system as claimed in claim 37 wherein the means for relatively translating moves the object with respect to the means for projecting.

47. The system as claimed in claim 37 wherein the first set of inspection sites are regularly arranged but sparse patterns.

48. The system as claimed in claim 37 wherein the first set of inspection sites are dense patterns.

49. The system as claimed in claim 37 wherein the beam of energy is a beam of radiant energy.

50. The system as claimed in claim 45 wherein the plurality of points are adjustable in the range of 32 to 1024.

51. The system as claimed in claim 37 wherein the data is 3-D data and wherein the system is triangulation-based.

52. The system as claimed in claim 37 wherein the data is 3-D data and wherein the system is line-scanned based.

* * * * *